United States Patent [19]

Jeffers

[11] Patent Number: 5,705,924
[45] Date of Patent: Jan. 6, 1998

[54] HALL EFFECT SENSOR FOR DETECTING AN INDUCED IMAGE MAGNET IN A SMOOTH MATERIAL

[75] Inventor: Frederick John Jeffers, Escondido, Calif.

[73] Assignee: Eastman Kodak Company, Rochester, N.Y.

[21] Appl. No.: 797,013

[22] Filed: Feb. 7, 1997

Related U.S. Application Data

[63] Continuation of Ser. No. 480,978, Jun. 7, 1995, abandoned, which is a continuation-in-part of Ser. No. 149,575, Nov. 9, 1993, abandoned.

[51] Int. Cl.⁶ .................... G01R 33/07; G01B 7/04
[52] U.S. Cl. .................... 324/207.2; 324/235
[58] Field of Search .................... 324/207.2–207.26, 324/252, 222, 225, 228, 232, 234, 235, 241, 243, 251, 174, 207.12; 338/32 H

[56] References Cited

U.S. PATENT DOCUMENTS

| | | | |
|---|---|---|---|
| 3,892,672 | 7/1975 | Gawron | 252/62.1 |
| 4,357,901 | 11/1982 | Fagen, Jr. et al. | 118/689 |
| 4,401,944 | 8/1983 | Narimatsu et al. | 324/207.21 |
| 4,492,922 | 1/1985 | Ohkubo | 324/207.21 |
| 4,538,108 | 8/1985 | Huschelrath | 324/235 |
| 4,646,014 | 2/1987 | Eulenberg | 324/224 |
| 4,712,064 | 12/1987 | Eckardt et al. | 324/208 |
| 4,725,776 | 2/1988 | Onodera et al. | 324/207.21 |
| 4,866,378 | 9/1989 | Redlich | 324/225 |
| 5,053,704 | 10/1991 | Fitzpatrick | 324/235 |
| 5,103,668 | 4/1992 | Grutel et al. | 73/119 A |
| 5,111,247 | 5/1992 | Nichols | 355/246 |
| 5,128,613 | 7/1992 | Takahashi | 324/235 |
| 5,130,650 | 7/1992 | Lemarquand | 324/207.22 |
| 5,159,268 | 10/1992 | Wu | 324/207.22 X |
| 5,166,729 | 11/1992 | Rathbun et al. | 355/208 |
| 5,187,522 | 2/1993 | Resch, III | 355/246 |
| 5,304,926 | 4/1994 | Wu | 324/207.2 |
| 5,341,097 | 8/1994 | Wu | 324/207.2 |
| 5,477,143 | 12/1995 | Wu | 324/207.21 |
| 5,614,821 | 3/1997 | Leiderer | 324/174 |

Primary Examiner—Sandra L. O'Shea
Assistant Examiner—Roger C. Phillips
Attorney, Agent, or Firm—William F. Noval

[57] ABSTRACT

In order to measure the permeability of a magnetic material, a permanent magnet is positioned at a distance from the surface of a magnetic material. A first magnetic field sensor is placed proximate the magnetic material on the magnetic axis of the permanent magnet. The axis of sensitivity of the magnetic field sensor is perpendicular to the field of the permanent magnet and in a plane perpendicular to the surface of the magnetic material. A second magnetic field sensor for compensating for temperature and stray field effects can be positioned perpendicular to the magnetic axis of the permanent magnet with its axis of sensitivity parallel to the axis of sensitivity of the magnetic field sensor.

21 Claims, 4 Drawing Sheets

HALL EFFECT SENSOR FOR DETECTING AN INDUCED IMAGE MAGNET IN A SMOOTH MATERIAL

REFERENCE TO RELATED APPLICATIONS

This application is a continuation of U.S. patent application Ser. No. 08/480,978, filed Jun. 7, 1995 now abandoned, which is a continuation-in-part application of U.S. patent application Ser. No. 08/149,575, filed Nov. 9, 1993 now abandoned.

FIELD OF THE INVENTION

This invention relates generally to detectors and, more particularly, to an induced field detector to detect properties of magnetic material or moving electrically conductive material.

BACKGROUND OF THE INVENTION

Many applications exist in which measurement of the magnetization of a magnetic material is desired. For example, a copier toner reservoir may include, in addition to the toner particles, high coercivity (2,000 Oe) BaFe carrier beads. The nominal toner concentration is one part toner and four parts carrier beads by volume. The ratio of the magnetic carrier beads to the toner particles must be maintained within prescribed limits for proper operation of the copier device. The magnetization of the magnetic material is measured and toner is added as appropriate.

Referring to FIG. 1A and FIG. 1B, a prior art magnetic material measuring device is shown. The device includes a ferrite core 11, a sensor coil 12, an oscillator coil 13, and a reference coil 14. An alternating current (e.g., 260 kHz) is applied to the oscillator coil 13. The ferrite core 11 is nominally centered in the structure. A magnetic field resulting from the current in the oscillator coil 13 is channeled by the ferrite core 11. The sensor coil 12 and the reference coil 14 are wired in opposition. In the absence of any magnetic body to be sensed, the net signal in coils 13 and 14 will be zero. The ferrite core 11 can be moved to cancel any imbalance in the combined signal from sensor coil 12 and reference coil 14. When a ferromagnetic body is positioned near one end of the magnetic field measuring device, a magnetization field will be induced in the ferromagnetic body. This magnetization will couple more strongly to the sensor coil 12 then to the reference coil 14 because of the relative distance between the ferromagnetic body and each of the coils 12 and 14. The magnitude of the resulting signal is used to determine the magnetization or the permeability of material 15. In the application involving the copier toner, the magnetic particle concentration in the toner can be determined by the magnitude of the imbalance signal.

The problem with the measurement of the magnetic particle concentration using the foregoing technique is that the applied field is very small and the coercivity of the ferromagnetic material is very large. Consequently, only a small magnetization is induced in the ferromagnetic material and a correspondingly small field is detected by the magnetic field measuring device. Typically, narrow band, high gain electronics must be used in the detection. In addition, the measuring device is very sensitive to relative positions of the sensor and reference coils due to variations in temperature.

A need has, therefore, been felt for apparatus and a technique for the measurement of the magnetization or permeability of a ferromagnetic material in which a very large magnetic field can magnetize the high coercivity particles or cause their physical rotation. There also exists a need for the detection of properties, speed and direction of an electrically conductive moving body.

SUMMARY OF THE INVENTION

One aspect of the present invention is directed to overcoming one or more of the problems set forth above. Briefly summarized, according to one aspect of the present invention, a strong permanent magnet generating a large magnetic field is used to induce a magnetic moment in a magnetic material. A sensor having only one axis of sensitivity is oriented so that its sensitive axis is perpendicular to the field from the magnet. The optimum orientation of the permanent magnet is 45° to the surface of the magnetic material. The magnetic moment is induced in the magnetic material. The induced magnetic moment creates a field which has a large component parallel to the sensitive axis of the sensor. Stray fields and residual temperature effects can be canceled by using a second sensor positioned on the opposite side of the magnet and oriented so that the sensitive axis of the second sensor is oriented parallel to the sensitive axis of the first sensor, and again perpendicular to the field from the permanent magnet.

The signal can be easily detected with an improved signal-to-noise ratio and the signal is virtually independent of temperature using the present invention. In addition, the second sensor can cancel stray fields and can increase the detected signal, thus improving the signal to noise ratio.

Another aspect of the present invention is directed to the detection of properties, speed and direction of an electrically conductive moving body with the permanent magnet, sensor arrangement referred to above, when an electrically conductive body passes near the permanent magnet, large electrical eddy currents are induced in the electrically conductive body. The eddy currents generate magnetic fields proportional to the size, conductivity and velocity of the body. The sensor(s) produces a signal indicative of velocity, direction and properties of the moving body.

These and other aspects, objects, features and advantages of the present invention will be more clearly understood and appreciated from a review of the following detailed description of the preferred embodiments and appended claims, and with reference to the accompanying drawings.

DETAILED DESCRIPTION OF THE INVENTION

Figure 1A:
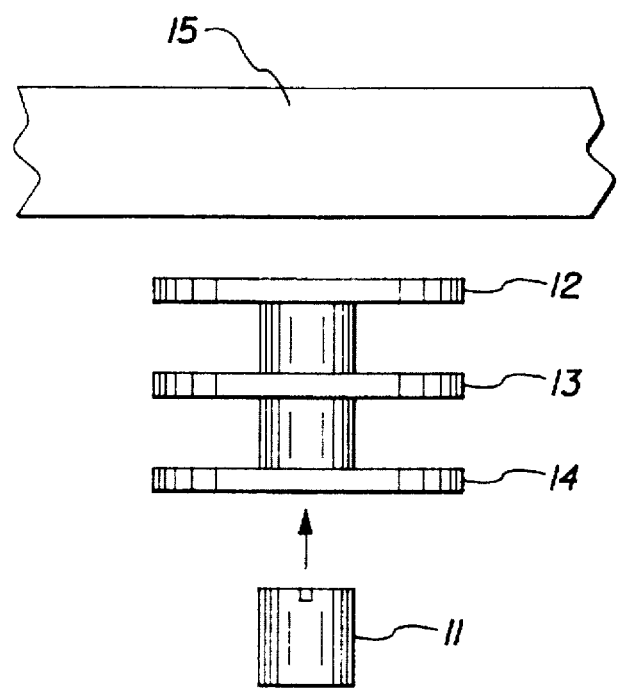
FIGS. 1A and 1B are diagrammatic representations of a detector for detecting a field from an induced magnetic moment according to the related art.
Figure 1B:
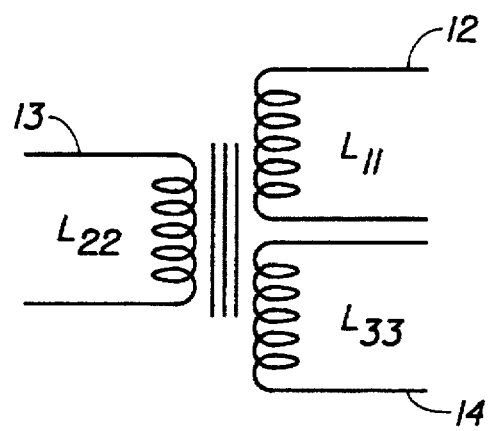

FIGS. 1A and 1B have been described with reference to the related art.

Figure 2:
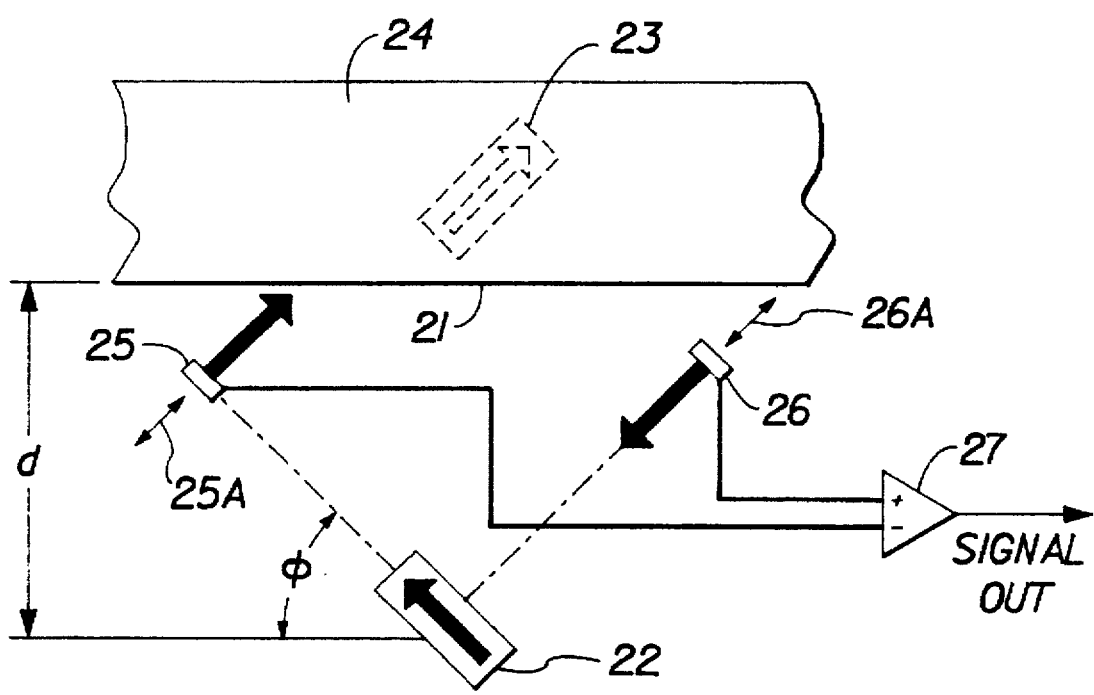
FIG. 2 is a diagrammatic representation of a detector for detecting a field from an induced magnetic moment according to one aspect of the present invention.

Referring next to FIG. 2, there will be described one embodiment of the present invention. As shown, a permanent magnet 22 is placed at a distance d from the surface 21 of a magnetic material 24. The magnetic axis of the magnet is rotated by an angle $\phi$ from an orientation parallel to the surface of the magnetic material 24. In the context of the present invention, the magnetic axis is defined as the vector parallel to the magnetic moment of the permanent magnet which passes through the center of mass of the permanent magnet. A first magnetic field sensor 25 is positioned along the magnetic axis of the permanent magnet 22 and in close proximity to the surface 21 of the magnetic material. Sensor 25 is of the type (such as a Hall detector) which has only one, well defined axis of sensitivity. The axis of sensitivity 25A of the magnetic field sensor 25 is perpendicular to the field from the permanent magnet 22. In applications requiring higher signal and reduced noise from stray fields and freedom from thermal drift, a second magnetic field sensor 26 (of the same type as sensor 35, i.e., a Hall sensor) is located on the opposite side of the permanent magnet 22 and in close proximity to the surface 21 of the magnetic material. The orientation of the axis of sensitivity 26A of second magnetic field sensor 26 is parallel to the axis of sensitivity 25A of induced magnetic field sensor 25. The output signal from the induced magnetic field sensor 25 and the output signal from second magnetic field sensor 26 are applied to difference amplifier 27. The output signal from difference amplifier 27 is a measure of the permeability of magnetic material 24 wherein temperature and stray field effects have been reduced.

The operation of the embodiment of present invention of FIG. 2 functions in the following manner. The field from the permanent magnet 22 induces a magnetic moment in the magnetic material 24 which is equivalent to a magnetic image 23 of the permanent magnet 22. (The concept of a magnetic image for determining magnetic fields is described in "Electromagnetic Fields and Waves" by Paul Lorraine and Dale Corson, W. H. Freeman & Co., San Francisco, 1970.) The field at the magnetic field sensor 25 and the second magnetic field sensor 26, positioned outside the magnetic material 24, are oriented such that, in the absence of the magnetic material 24, no magnetic field is detected. In the presence of the magnetic material 24, the induced field, arising from the image magnet 23 internal to the magnetic material 24, provides a component which can be detected by the magnetic field sensor 25 and, when present, the second magnetic field sensor 26. Any signal that the magnetic field sensor 25 detects will be caused by the magnetic moment induced in the magnetic material 24 by the permanent magnet 22. The signal induced in the second magnetic field sensor 26 can be subtracted from the signal induced in the magnetic field sensor 25 to cancel the effects of stray fields and temperature changes. Because the field at the second sensor 26 originating from the image magnet 23 is in a direction opposite to the field at the first sensor 25, this subtraction results in a larger net signal as well as a cancellation of stray fields and temperature drift.

In the application in which the apparatus is used to measure a permeability of a toner sample, the magnetic field sensors 25 and 26 are preferably Hall effect devices. The permanent magnet 22 is selected to provide a nominal 1000 Oe field in the sample. This field is sufficiently large to appreciably magnetize the high coercivity BaFe carrier beads which are mixed with the toner particles. The angle $\phi$ is selected to be 45°, an angle which provides the maximum signal for sensor 25 as a result of the induced magnetic field. However, the axis can be in the range of 35° to 55°.

The apparatus of FIG. 1 can also be used to measure the field arising from the magnetic moment induced in a single layer of recording tape, to measure the induced field from various thicknesses of magnetic materials, to measure the induced field (and therefore the concentration of impurities) from a sample of brass contaminated with iron, and to measure the induced field from the portrait region of currency.

Operation of the embodiment of FIG. 1 is based on the principle that the magnetic moment induced in a magnetic material by an external magnet can be determined by producing an image magnet symmetrically placed in the magnetic material. As will be clear from FIG. 2, the magnetic field sensor is oriented such that no magnetic field will be detected from the primary permanent magnet. However, the induced image magnet will produce fields which can be readily detected by the magnetic field sensor. It will be clear that second sensor 26 can be used as the magnetic field sensor in the absence of sensor 25. It will be further clear that the requirement on the magnetic field sensor is that the sensor axis be oriented perpendicular to field produced by the permanent magnet alone, and still be close enough to the surface of the magnetic material to be able to detect the magnetic field from the magnetic material under test.

Figure 3:
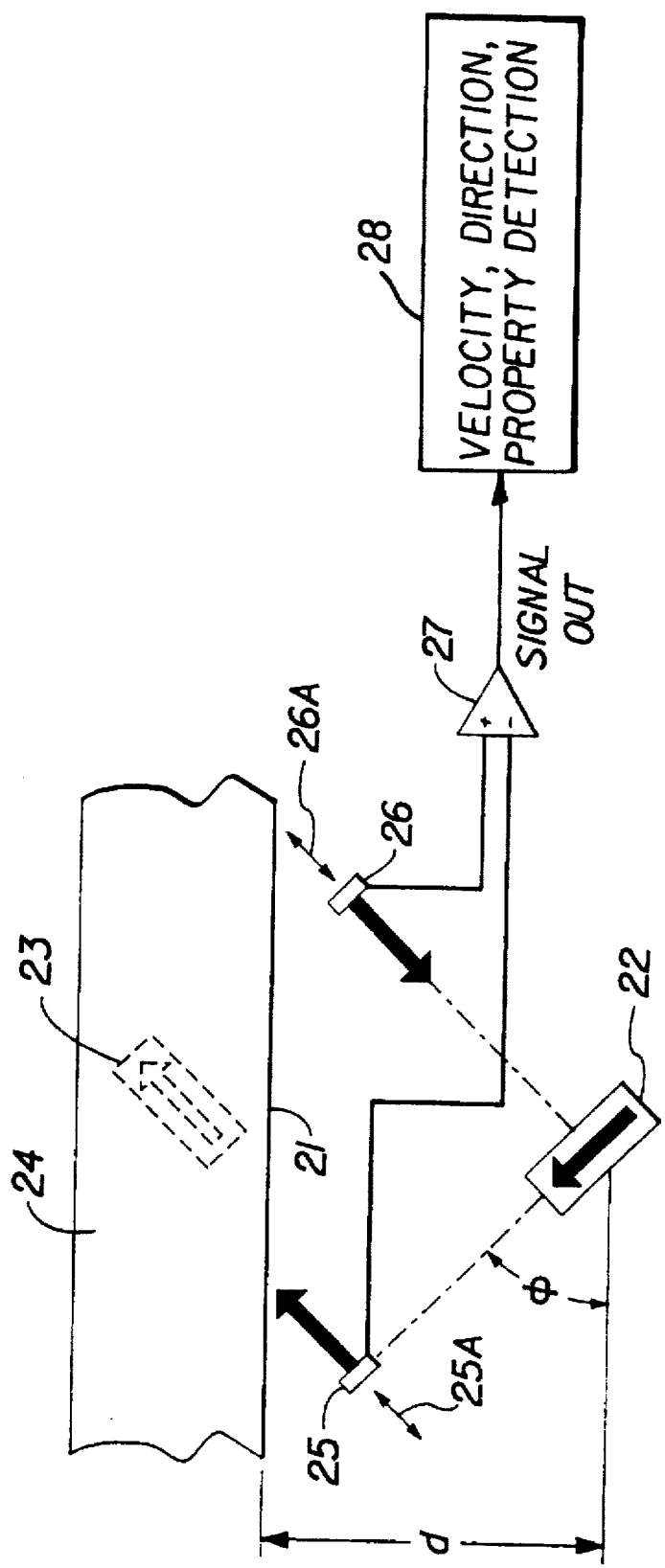
FIG. 3 is a diagrammatic representation of a detector for detecting the velocity, direction and properties of an electrically conductive moving body according to another aspect of the present invention.

Referring now to FIG. 3, there is shown another embodiment of the present invention for detecting the velocity, direction and properties of an electrically conductive moving body. As shown, permanent magnet 22 (such as a very strong NdFeB magnet), has a magnetic axis oriented at substantially 45° to the surface 21' of electrically conductive moving body 24'. The magnetic field at surface 21' is very large (i.e., about 2000 Oersteds). Magnetic field sensors 25 and 26 are located on either side of magnet 22. Sensors 25 and 26 are the type (Hall detector) which has only one well-defined axis of sensitivity. The sensitive axes of sensors 25 and 26 are perpendicular to the local magnetic field from magnet 22.

The signals from sensors 25, 26 may be subtracted in op amp 27 to cancel common mode noise field if required. Because the sensitive axes of the sensors 25, 26 are perpendicular to the several thousand Oe field from the magnet 22, these fields are not detected, and a high gain can be used in the detection electronics 28 so as to give a very high sensitivity.

When an electrically conductive body 24' passes near sensors 25, 26, the strong magnetic field of magnet 22 induces large electrical eddy currents in the conductive body 24. These, in turn, generate sizable magnetic fields proportional to the product of the conductivity, size of the body 24' under test, and its velocity. Hence, the device gives a signal which detects the direction and speed of a given conductive body properties of the body, and hence can also differentiate between various bodies moving at the same speed.

Figure 4:
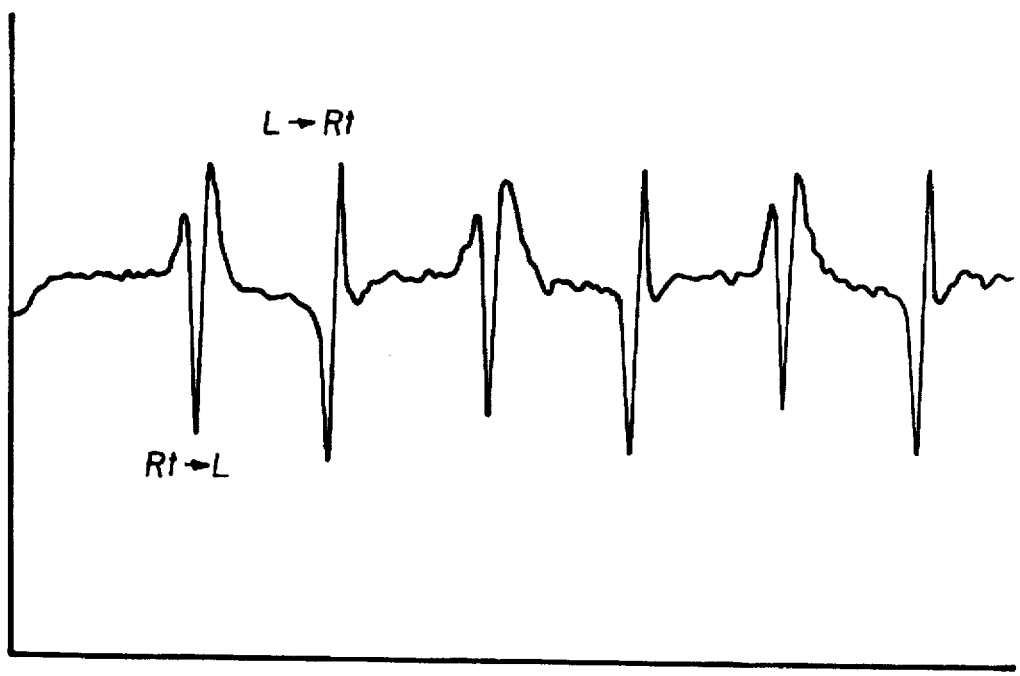
FIGS. 4 and 5 are graphical views useful in explaining the detector of FIG. 3.
Figure 5:
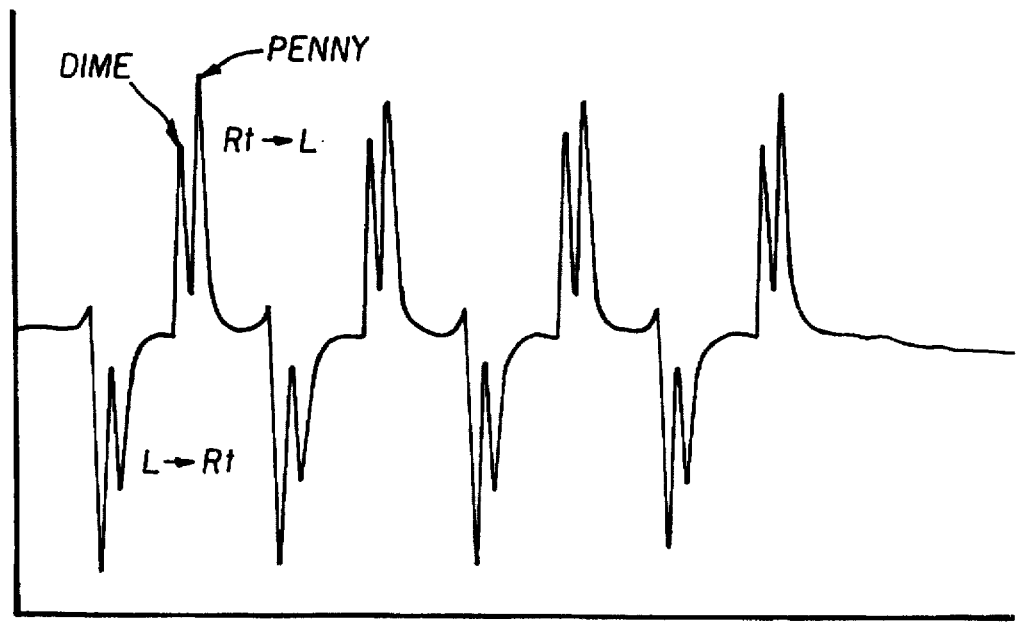

FIG. 4 shows the signal resulting from moving an aluminum soft drink can back and forth past sensors 25,26 at about 4 inches/second. In this, and the application below, only sensor 25 is used. The right-to-left and left-to-right curves are completely different and the signal is proportional to the object speed.

FIG. 3 shows the signal resulting from moving a dime and an adjacent penny back and forth past sensors 25,26. The polarity of the signal reverses for the two directions of motion, and the 1975 penny signal is higher than that of the 1985 dime because it is larger and more conductive.

The embodiment of FIG. 3 is useful as a velocity detector for uniform conductors and in detecting and differentiating conductive objects having different sizes and conductivities. At a constant velocity and body thickness, the induced eddy current field is a measure of the conductivity of the body being tested.

Any electrically conductive body, whether of magnetic or nonmagnetic conductive material may be tested. The moving body is preferably smooth and featureless. For thin magnetic conductive bodies, the detected signal is also proportional to the body thickness.

While the invention has been described with particular reference to a preferred embodiment, it will be understood by those skilled in the art that various changes may be made and equivalents may be substituted for elements of the preferred embodiment without departing from the invention. In addition, many modifications may be made to adapt a particular situation and material to a teaching of the invention without departing from the essential teachings of the present invention.

As is evident from the foregoing description, certain aspects of the invention are not limited to the particular details of the examples illustrated and it is, therefore, contemplated that other modifications and applications will occur to those skilled in the art. It is accordingly intended that the claims shall cover all such modifications and applications as do not depart from the true spirit and scope of the invention.

PARTS LIST 11 ferrite core
12 sensor coil
13 oscillator coil
14 reference coil
15 magnetic material
21, 21' surface of magnetic material, conductive material
22 permanent magnet
23 image magnet
24, 24' magnetic material, conductive material
25 first magnetic field sensor
25A axis of sensitivity of induced magnetic field sensor 25
26 second magnetic field sensor
26A axis of sensitivity of reference magnetic field sensor 26
27 difference amplifier
28 detection circuit

What is claimed is:

1. An induced field sensor apparatus comprising:
    a permanent magnet located proximate a surface of stationary, smooth surface material to be sensed, said permanent magnet having its magnetic axis oriented at an acute angle f with respect to a plane parallel to the said surface of said material such that the magnetic moment induced in said stationary magnetic material produces an image magnet in said material; and
    a first Hall effect magnetic field sensor having only a single axis of sensitivity positioned proximate said surface of said magnetic material, said magnetic field sensor having its axis of sensitivity perpendicular to the field of said permanent magnet so as to detect the field produced by said induced image magnet in said material.

2. The apparatus of claim 1 wherein said angle $\phi$ is approximately 45°.

3. The apparatus of claim 1 wherein said angle $\phi$ is in the range of 35° to 55°.

4. The apparatus of claim 1 further comprising:
    a second Hall effect magnetic field sensor having only a single axis of sensitivity, said second magnetic field sensor being positioned proximate said surface of said magnetic material, said second magnetic field sensor having its axis of sensitivity perpendicular to said field of said permanent magnet.

5. The apparatus of claim 1 wherein said first magnetic field sensor is positioned on said magnetic axis of said permanent magnet.

6. The apparatus of claim 5 further comprising:
    a second Hall effect magnetic field sensor having only a single axis of sensitivity, said second magnetic field sensor being positioned proximate said surface of said material, said second magnetic field sensor having its axis of sensitivity perpendicular to said magnetic axis of said permanent magnet, said second magnetic field sensor having its axis of sensitivity parallel to said axis of sensitivity of said first magnetic field sensor.

7. The apparatus of claim 6 wherein said material to be sensed is magnetic material, wherein said permanent magnet induces a magnetic field in said magnetic material, and wherein said first and second magnetic field sensors sense said induced magnetic field in said magnetic material.

8. The method of measuring the magnetic permeability of a magnetic material having a surface, the method comprising the steps of:
    positioning a permanent magnet in the vicinity of stationary, smooth surface magnetic material, the axis of said permanent magnet being positioned at an acute angle f with respect to said surface of said magnetic material such that the magnetic moment induced in said stationary magnetic material produces an image magnet in said material; and
    positioning a first Hall effect magnetic field sensor having only a single axis of sensitivity along said axis of said permanent magnet proximate said surface of said magnetic material, said magnetic field sensor having its axis of sensitivity perpendicular to said axis of said permanent magnet so as to detect the field produced by said induced image magnet in said material.

9. The method of claim 8 further including the step of positioning a second Hall effect magnetic field sensor having only a single axis of sensitivity perpendicular to said axis of said permanent magnet, said axis of sensitivity of said second magnetic field sensor being parallel to said axis of sensitivity of said first magnetic field sensor.

10. The method of claim 9 wherein said first and second magnetic field sensors produce output signals and further including the step of producing a difference signal between said output signal of said first magnetic field sensor and the output signal of said second magnetic field sensor, said difference signal being indicative of the permeability of said magnetic material and being free of noise due to stray fields and temperature drift.

11. The method of claim 10 wherein said positioning said permanent magnet step includes the step of selecting said angle $\phi$ to be approximately 45°.

12. The method of claim 11 wherein said positioning said permanent magnet step includes the step of selecting said angle $\phi$ to be between 35° and 55°.

13. Apparatus for measuring a magnetization field induced in a stationary, smooth surface magnetic material, said apparatus comprising:
    a permanent magnet positioned in a vicinity of the surface of said stationary magnetic material, said permanent magnet having its axis oriented at an acute angle f with respect to said surface of said magnetic material such that the magnetic moment induced in said stationary magnetic material produces an image magnet in said material; and
    a first Hall effect magnetic field sensor having only a single axis of sensitivity positioned proximate said surface of said magnetic material, said first magnetic field sensor having its axis of sensitivity oriented to be perpendicular to the magnetic field from said permanent magnet, said first magnetic field sensor positioned on said axis of said magnetic moment so as to detect the field produced by said induced image magnet in said material.

14. The apparatus of 13 further including a second Hall effect magnetic field sensor having only a single axis of symmetry, said second magnetic field sensor being positioned proximate said surface of said magnetic material, said second magnetic field sensor having its axis of sensitivity oriented perpendicular to said axis of said permanent magnet.

15. The apparatus of 14 wherein said axis of sensitivity of said first magnetic field sensor and said axis of sensitivity of said second magnetic field sensor are parallel.

16. The apparatus of claim 14 including a differential amplifier connected to said sensors for producing a difference signal which is indicative of the permeability of said magnetic material and being free of noise due to stray fields and temperature drift.

17. The apparatus of claim 13 wherein said angle φ is approximately 45°.

18. Apparatus for measuring the velocity of an electrically conductive nonmagnetic, smooth surface moving material, said apparatus comprising:

a permanent magnet having an axis oriented at an acute angle of f with respect to an electrically conductive nonmagnetic, smooth surface moving material; and a first Hall effect magnetic field sensor having only a single axis of sensitivity positioned proximate said electrically conductive material and having its axis of sensitivity perpendicular to said axis of said permanent magnet, said first magnetic field sensor detecting a magnetic field generated by eddy currents induced in said electrically conductive material by said field from said permanent magnet wherein the signal derived from the induced eddy current fields is proportional to the velocity of said moving material.

19. The apparatus of claim 18 wherein said first magnetic field sensor is positioned on the axis of said permanent magnetic, said apparatus further including a second Hall effect magnetic field sensor having only a single axis of sensitivity, said second magnetic field sensor positioned proximate said electrically conductive material and having its axis of sensitivity oriented perpendicular to said axis of said permanent magnet and parallel to said axis of sensitivity of said first magnetic field sensor.

20. The apparatus of claim 18 including a detection circuit connected to said first magnetic field sensor for detecting the velocity, direction of movement, and/or property of said electrically conductive moving material.

21. The apparatus of claim 19 including a detection circuit connected to said first and said second magnetic field sensors for detecting the velocity, direction of movement, and/or property of said electrically conductive moving material.

* * * * *